(12) United States Patent
Chou

(10) Patent No.: US 7,547,115 B2
(45) Date of Patent: Jun. 16, 2009

(54) PACKAGE STRUCTURE FOR LIGHT EMITTING DIODE AND APPLICATIONS OF THE SAME

(75) Inventor: Shen-Hong Chou, Miaoli County (TW)

(73) Assignee: AU Optronics Corporation, Hsinchu (TW)

( * ) Notice: Subject to any disclaimer, the term of this patent is extended or adjusted under 35 U.S.C. 154(b) by 95 days.

(21) Appl. No.: 11/439,155

(22) Filed: May 23, 2006

(65) Prior Publication Data
US 2007/0274069 A1  Nov. 29, 2007

(51) Int. Cl.
*F21V 3/02* (2006.01)
*F21V 5/00* (2006.01)
*H01L 33/00* (2006.01)

(52) U.S. Cl. ............... 362/244; 362/237; 362/555; 257/98

(58) Field of Classification Search ............ 362/800, 362/612, 555, 227, 231, 230, 234, 235, 236, 362/237, 240, 244; 257/89, 98, 100
See application file for complete search history.

(56) References Cited

U.S. PATENT DOCUMENTS

| D204,319 S | * | 4/1966 | Stewart | D16/137 |
| 4,638,343 A | * | 1/1987 | Althaus et al. | 257/98 |
| 4,992,704 A | * | 2/1991 | Stinson | 315/312 |
| 5,803,579 A | * | 9/1998 | Turnbull et al. | 362/516 |
| 5,825,051 A | * | 10/1998 | Bauer et al. | 257/82 |
| 6,404,131 B1 | * | 6/2002 | Kawano et al. | 315/82 |
| 6,674,096 B2 | * | 1/2004 | Sommers | 257/98 |
| 6,923,548 B2 | * | 8/2005 | Lim | 362/612 |
| 6,997,580 B2 | * | 2/2006 | Wong | 362/311 |
| 7,034,343 B1 | * | 4/2006 | Kim et al. | 257/98 |
| 7,126,159 B2 | * | 10/2006 | Itai et al. | 257/91 |
| 2002/0085390 A1 | * | 7/2002 | Kiyomoto et al. | 362/555 |
| 2003/0052594 A1 | * | 3/2003 | Matsui et al. | 313/495 |
| 2003/0072153 A1 | * | 4/2003 | Matsui et al. | 362/231 |
| 2004/0099874 A1 | * | 5/2004 | Chang et al. | 257/98 |
| 2004/0170018 A1 | * | 9/2004 | Nawashiro | 362/244 |
| 2004/0245591 A1 | * | 12/2004 | Wang et al. | 257/433 |
| 2007/0057268 A1 | * | 3/2007 | Hamanaka et al. | 257/98 |

FOREIGN PATENT DOCUMENTS

WO   WO 2004066002 A1 * 8/2004

* cited by examiner

*Primary Examiner*—Ismael Negron
(74) *Attorney, Agent, or Firm*—Morris, Manning & Martin LLP; Tim Tingkang Xia

(57) ABSTRACT

A light emitting diode (LED) package structure. In one embodiment, the LED package structure includes at least three lenses, each lens having a body portion with at least a first surface, a second surface, a third surface and a fourth surface, and at least three LED chips, each LED chip being capable of emitting light in a unique color and having a first conductive lead and a second conductive lead and embedded in the body portion of a corresponding lens such that the first conductive lead and the second conductive lead extend out of the body portion from one of the third surface and the fourth surface of the corresponding lens. The at least three lenses and the at least three LED chips are assembled such that the first surface of a lens is in contact with the second surface of one of the rest of the at least three lenses and the at least three LED chips are positioned substantially proximate to each other.

13 Claims, 6 Drawing Sheets

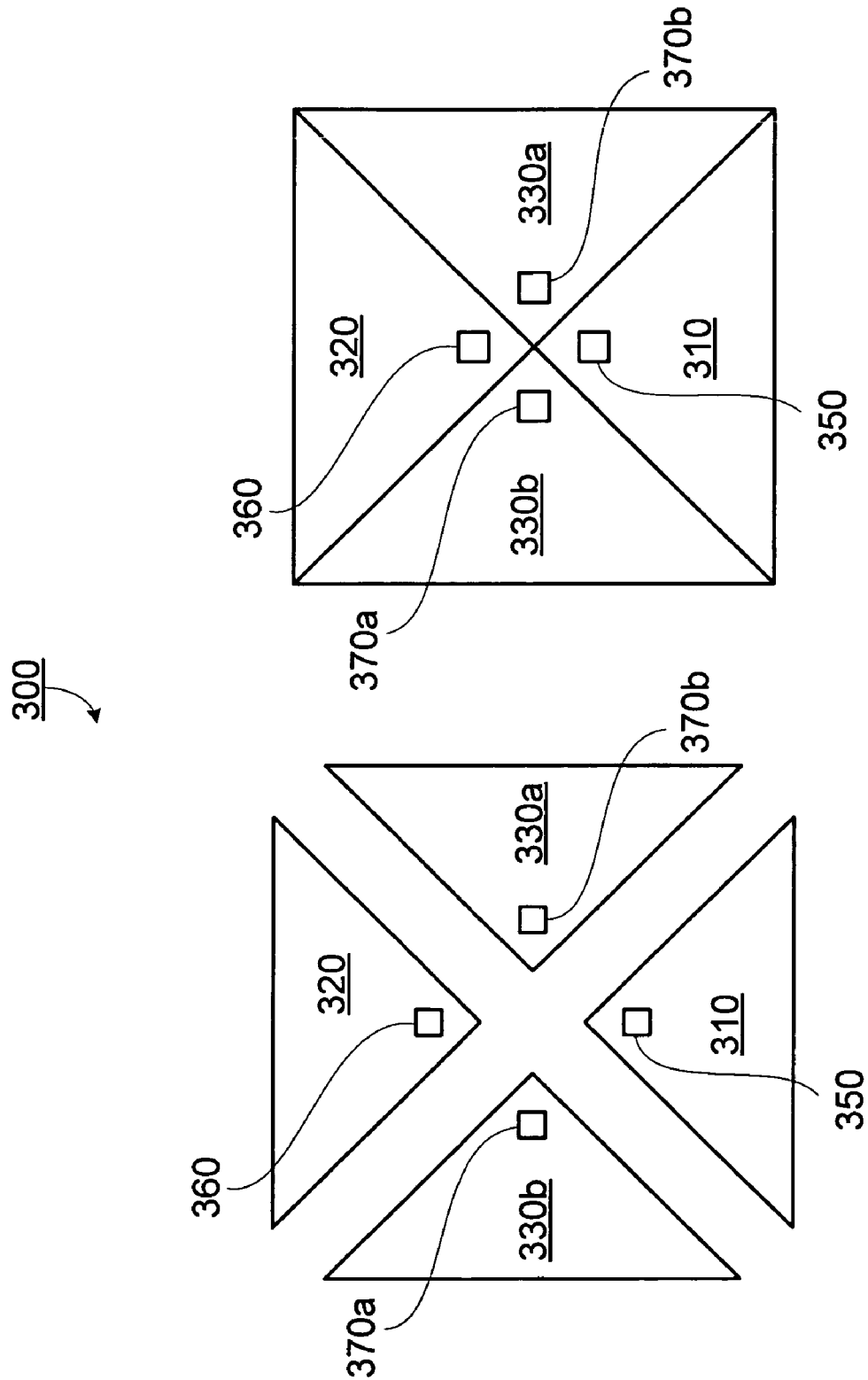

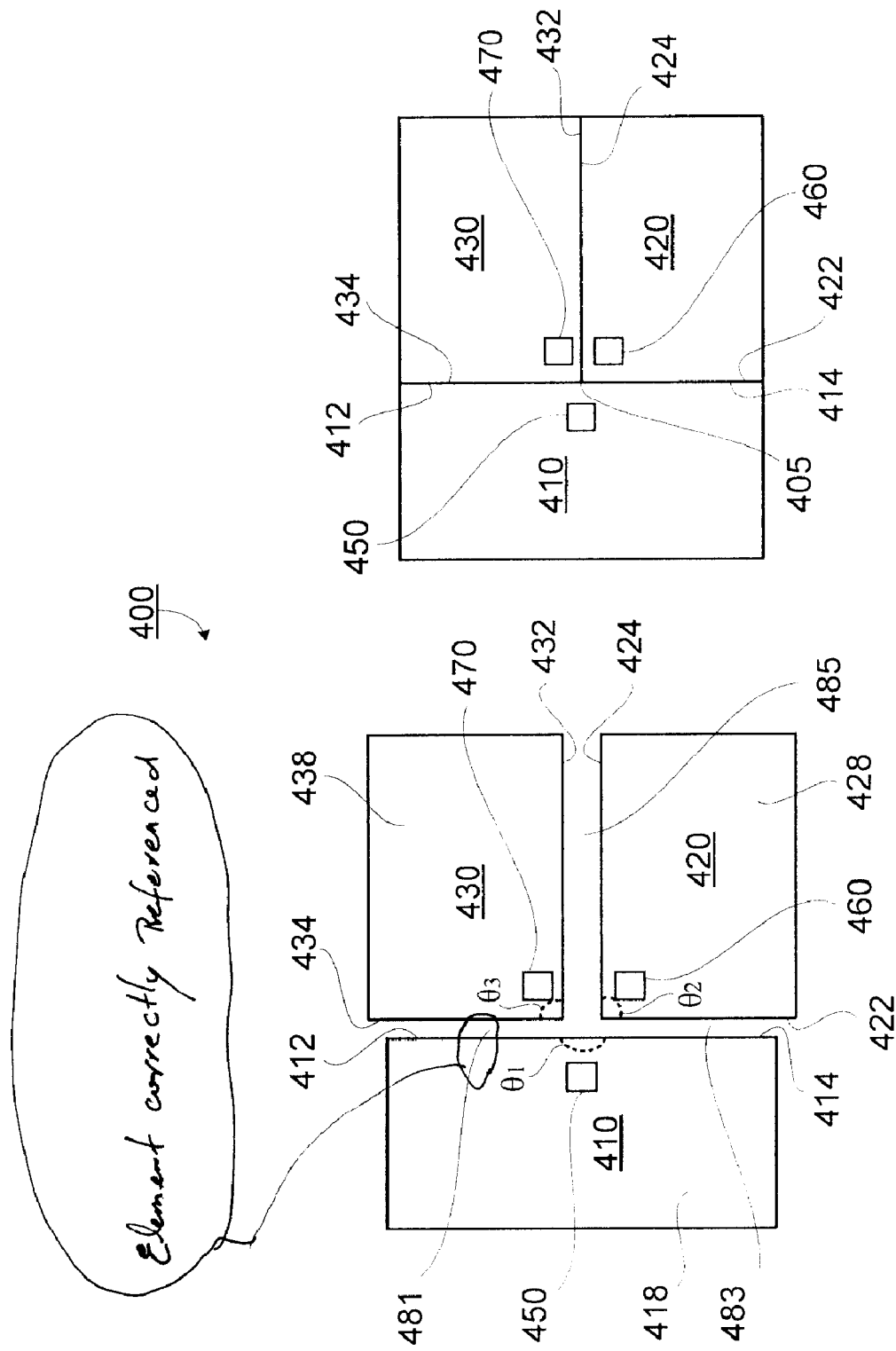

PACKAGE STRUCTURE FOR LIGHT EMITTING DIODE AND APPLICATIONS OF THE SAME

FIELD OF THE INVENTION

The present invention is generally related to light emitting diodes, and, more particularly, is related to one or more package structures for light emitting diodes and applications of the same.

BACKGROUND OF THE INVENTION

Because of the advantage of small size, low power consumption and long life span, light emitting diodes (hereinafter "LEDs") are widely used in household appliances, computer peripherals, communication products, traffic lights and car lamps, and other types of applications. An LED is a junction diode formed by a p-n junction having a direct junction between a p-type layer and an n-type layer or a double-hetero junction having an active layer sandwiched between a p-type layer and an n-type layer, on a heavily doped semiconductor compound base. The LED has a pair of conductive leads (or pins) connected to the p-type layer and the n-type layer, respectively, for electrical connection with a power source. For such an LED, light can be emitted by the p-n junction or the active layer by applying a forward voltage to between the p-type layer and the n-type layer.

Usually, an LED emits light only in a single color. As development of communication products such as mobile phones and liquid crystal displays that employ white light for illumination liquid crystal molecules thereof, there is a need to develop colorful LED panels to display colorful images and/or to provide a white light source of LEDs. A white light source is a combination of red, green, and blue LEDs whose combined light forms white light. Therefore, it is necessary to develop an LED package assembly with three LEDs, generally a red LED, a blue LED, and a green LED.

Conventionally, in order to achieve a full colored LED display and/or to provide an LED white light source, at least three colored LEDs including a red LED, a blue LED, and a green LED are packaged spatially close to each other in a single unit. For example, FIG. 5 shows schematically a cross-sectional view of a conventional LED package 500 by encapsulating a red LED 550, a blue LED 560, and a green LED 570 with a transparent resin 510 for providing a white light source. Such an LED package can provide a uniform mixing of light emitted from the red LED 550, the blue LED 560, and the green LED 570. An LED is in the form of a small die of a size of approximate 0.3 mm. For the conventional LED package assembly, it would be a very time consuming and costly process to distinguish and identify the bins of the LED packages assembly. On the other hand, certain types of LEDs, for example, blue Gallium Nitride (GaN) or bluish Indium Gallium-nitride (InGaN) LEDs, may easily suffer deterioration by static electricity since the p-n junction thereof is very close to the surface. If conductive leads of the LEDs happen to be touched in the LED packages assembly, even small currents can destroy the susceptible LEDs.

Therefore, a heretofore unaddressed need exists in the art to address the aforementioned deficiencies and inadequacies.

SUMMARY OF THE INVENTION

In one aspect, the present invention relates to an LED package structure. In one embodiment, the LED package structure includes at least three lenses. Each lens has a body portion with at least a first surface, a second surface, a third surface and a fourth surface. The LED package structure further includes at least three LED chips. Each LED chip is capable of emitting light in a unique color and has a first conductive lead and a second conductive lead. Each LED chip is embedded in the body portion of a corresponding lens such that the first conductive lead and the second conductive lead extend out of the body portion from one of the third surface and the fourth surface of the corresponding lens.

In one embodiment, the body portion of each lens has a cross-sectional shape selected from the list of a sector, a closed loop, a triangle, a quadrilateral and a polygon. The first surface and the second surface of each lens define an angle, $\theta_i$, therebetween, where the angle $\theta_i$ satisfies the relationship of $90° \leq \theta_i \leq 180°$, where i=1, 2, and 3. In one embodiment, the first surface and the second surface of each lens are capable of refracting light emitted from a corresponding embedded LED chip. Each lens is made of a transparent material. In one embodiment, the transparent material comprises glass, plastic, resin, or a combination of them.

In one embodiment, the at least three LED chips include at least a first LED chip capable of emitting light in a red color, a second LED chip capable of emitting light in a blue color, or a third LED chip capable of emitting light in a green color.

The at least three lenses and the at least three LED chips are assembled such that the first surface of a lens is in contact with the second surface of one of the rest of the at least three lenses and the at least three LED chips are positioned substantially proximate to each other. As assembled, the at least three lenses define an axis that is coincident with the cross line of the first surface and the second surface of each lens, and the at least three LED chips are aligned in an array with a geometrical center substantially at the axis.

Additionally, the LED package structure may include a transparent medium placed between the first surface of a lens and the second surface of one of the rest of the at least three lenses.

In another aspect, the present invention relates to a method for packaging LEDs. In one embodiment, the method includes the step of forming an optical element having a lens and an LED chip, where the lens has a body portion with at least a first surface, a second surface, a third surface and a fourth surface, and the LED chip has a first conductive lead and a second conductive lead. In one embodiment, the forming step comprises the step of embedding the LED chip into the body portion of the lens such that the first conductive lead and the second conductive lead of the LED chip extend out of the body portion from one of the third surface and the fourth surface of the lens.

Furthermore, the method includes the step of assembling an LED package structure having at least a first optical element having an LED chip capable of emitting light in a red color, a second optical element having an LED chip capable of emitting light in a blue color and a third optical element having an LED chip capable of emitting light in a green color such that the first surface of the lens of one of the first, second and third optical elements is in contact with the second surface of the lens of one of the rest of the first, second and third optical elements and the three LED chips are positioned substantially proximate to each other.

In yet another aspect, the present invention relates to an optical element for an LED package structure. In one embodiment, the optical element includes a lens having a body portion with at least a first surface, a second surface, a third surface and a fourth surface, and an LED chip having a first conductive lead and a second conductive lead and embedded in the body portion of the lens such that the first conductive lead and the second conductive lead extend out of the body portion from one of the third surface and the fourth surface of the lens.

The body portion of the lens has a cross-sectional shape selected from the list of a sector, a closed loop, a triangle, a quadrilateral and a polygon. The first surface and the second surface of the lens define an angle, θ, therebetween, where the angle θ satisfies the relationship of $90° \leq \theta \leq 180°$. In one embodiment, the first surface and the second surface of the lens are capable of refracting light emitted from the LED chip. The lens is made of a transparent material, where the transparent material comprises glass, plastic, resin, or a combination of them.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein:

FIG. 3a shows schematically a cross-sectional view of an LED package structure according to one embodiment of the present invention.

FIG. 3b shows schematically a cross-sectional view of an LED package structure according to another embodiment of the present invention.

FIG. 4a shows schematically a cross-sectional view of an LED package structure according to one embodiment of the present invention.

FIG. 4b shows schematically a cross-sectional view of an LED package structure according to another embodiment of the present invention.

DETAILED DESCRIPTION OF THE INVENTION

Figure 1:
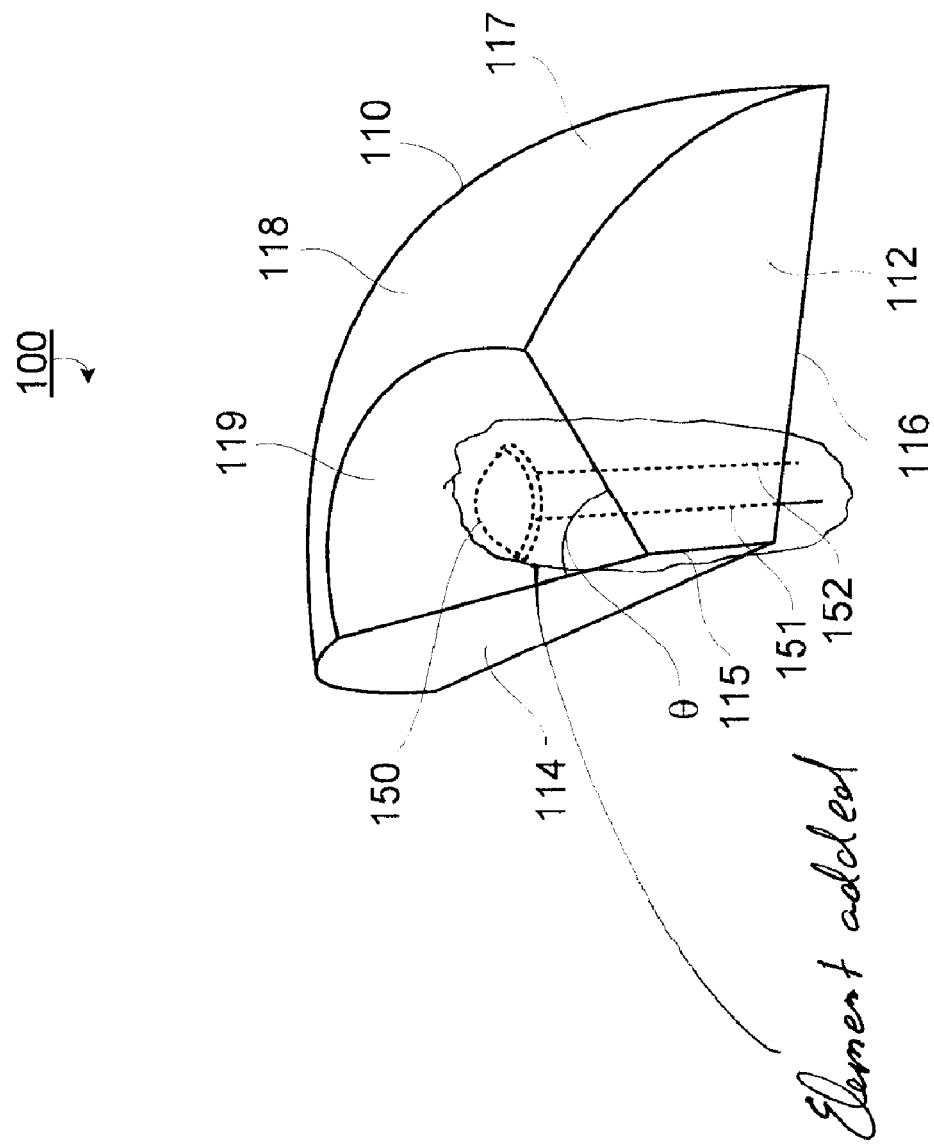
FIG. 1 shows schematically a perspective view of an optical element according to one embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise.

The description will be made as to the embodiments of the present invention in conjunction with the accompanying drawings of FIGS. 1-4. In accordance with the purposes of this invention, as embodied and broadly described herein, this invention, in one aspect, relates to an LED package structure having at least one or more optical elements.

Referring now to FIG. 1, an optical element 100 for an LED package structure is shown according to one embodiment of the present invention. The optical element 100 has a lens 110 having a body portion 118 with a first surface 112, a second surface 114, a third surface 116, and a fourth surface 117 that intersects with the first surface 112, the second surface 114, and the third surface 116, and an LED chip 150 having a first conductive lead 151 and a second conductive lead 152. The LED chip 150 is embedded in the body portion 118 of the lens 110 such that the first conductive lead 151 and the second conductive lead 152 of the LED chip 150 extend out of the body portion 118 from one of the third surface 116 and the fourth surface 117 of the lens 110. The first surface 112 and the second surface 114 of the lens 110 are capable of refracting light emitted from the LED chip 150. The body portion 118 of the lens 110 has a cross-sectional shape of a sector. The body portion 118 of the lens 110 can also be formed to have a cross-sectional shape of a closed loop, a triangle, a quadrilateral or a polygon. The first surface 112 and the second surface 114 the lens 110 forms a cross line 115 and define an angle θ that is not less than 90° and not greater than 180°. As shown in FIG. 1, the angle θ is about 120°. The lens 110 is made of a transparent material including glass, plastic, resin or the like. As shown in FIG. 1, the body portion 118 further has a fifth surface 119 that intersects with the first surface 112, the second surface 114 and the fourth surface 117.

The LED chip is electrically coupled to a source of power through its first and second conductive leads for electrical power supply so as to emit light therefrom. Usually, the LED chip is formed to emit light in a single color.

Figures 2A, 2B:
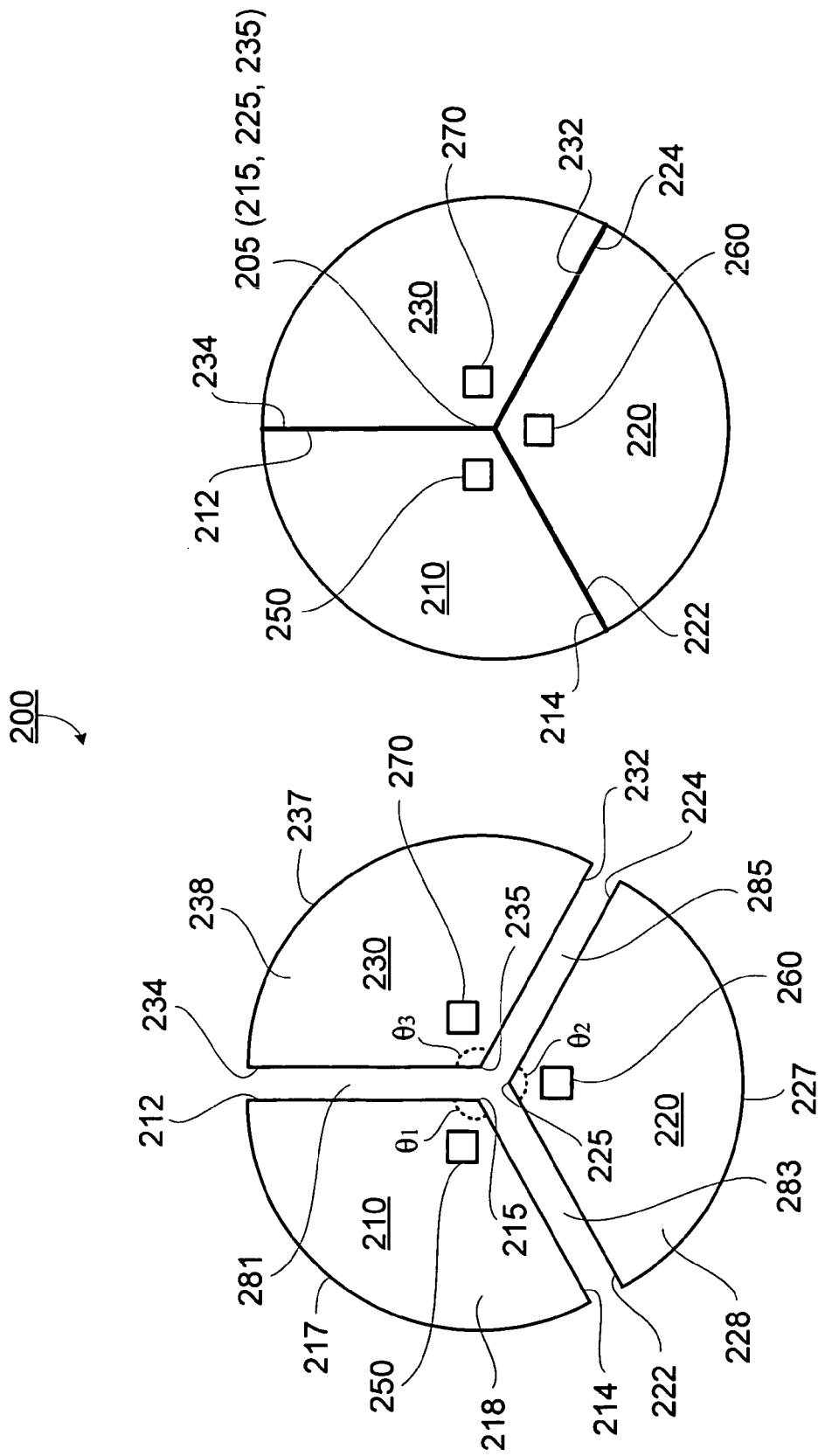
FIG. 2a shows schematically a cross-sectional view of an LED package structure according to one embodiment of the present invention.
FIG. 2b shows schematically a cross-sectional view of an LED package structure according to another embodiment of the present invention.
Figure 2C:
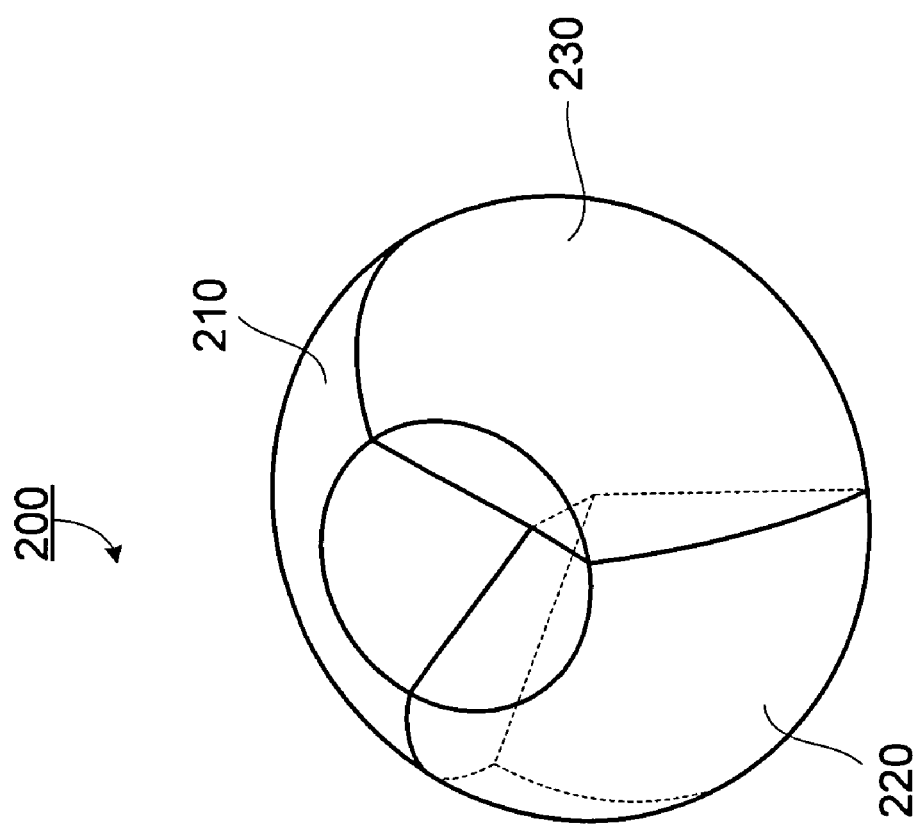
FIG. 2c shows schematically a perspective view of an LED package structure shown in FIG. 2b.
Figure 5:
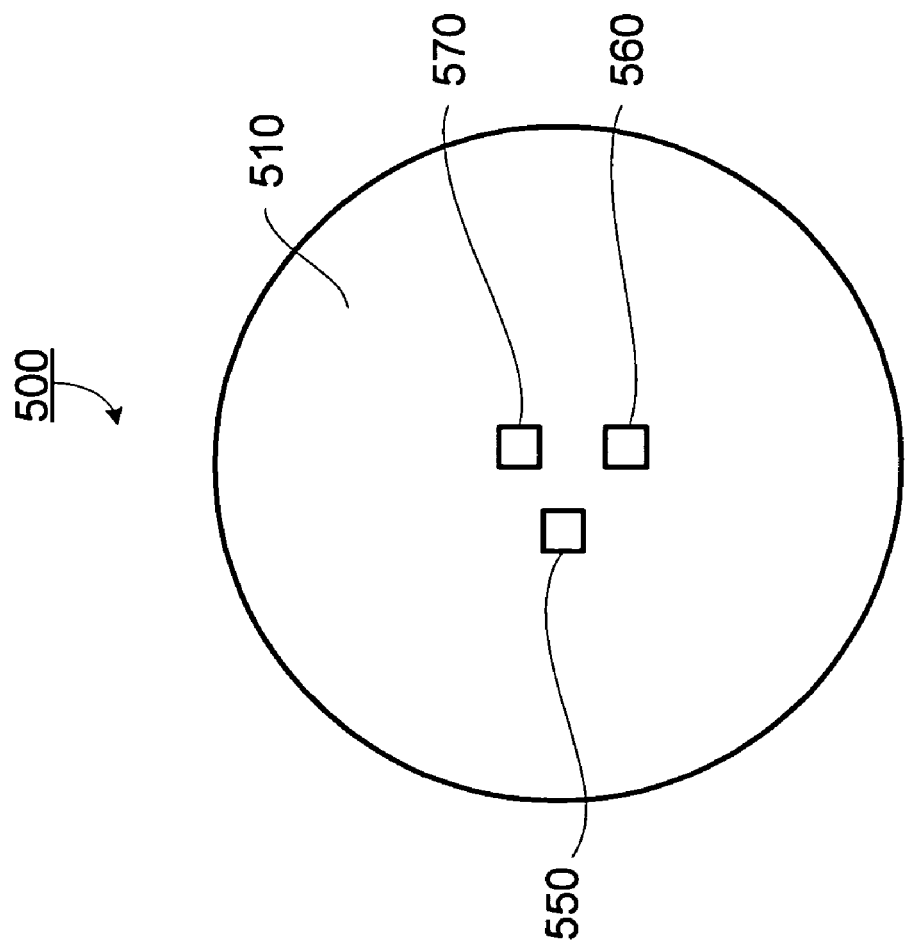
FIG. 5 shows schematically a cross-sectional view of a conventional LED package structure.

Referring to FIGS. 2a-2c, an LED package structure 200 is shown according to one embodiment of the present invention. The LED package structure 200 includes three lenses 210, 220 and 230. Each lens 210 (220, 230) has a body portion 218 (228, 238) with at least a first surface 212 (222, 232), a second surface 214 (224, 234) and a third surface (not shown), and a fourth surface 217 (227, 237).

As shown in FIGS. 2a and 2b, the body portion 218 (228, 238) of each lens 210 (220, 230) has a cross-sectional shape of a sector. The first surface 212 (222, 232) and the second surface 214 (224, 234) of each lens 210 (220, 230) define a cross line 215 (225, 235) and an angle, $\theta_i$, therebetween, where the angle $\theta_i$ satisfies the relationship of $90° \leq \theta_i \leq 180°$, (i=1, 2, 3). Each of the angles $\theta_1$, $\theta_2$ and $\theta_3$ can be substantially identical or different. In the exemplary embodiments shown in FIGS. 2a-2c, each of the angles $\theta_1$, $\theta_2$ and $\theta_3$ is substantially same, which is about 120°. The first surface 212 (222, 232) and the second surface 214 (224, 234) of each lens 210 (220, 230) are capable of refracting light emitted from a corresponding embedded LED chip. Each lens 210 (220, 230) is made of a transparent material. The transparent material comprises glass, plastic, resin, or the like.

The LED package structure 200 further includes three LED chips 250 (260, 270). Each LED chip 250 (260, 270) has a first conductive lead and a second conductive lead (not shown) and is embedded in the body portion 218 (228, 238) of a corresponding lens 210 (220, 230) such that the first conductive lead and the second conductive lead extend out of the body portion 218 (228, 238) from one of the third surface and the fourth surface fourth surface 217 (227, 237) of the corresponding lens 210 (220, 230). Radially, each LED chip (250, 260, 270) is positioned proximate to a corresponding cross line (215, 225, 235). The first conductive lead and the second conductive lead of each LED chip 250 (260, 270) are electrically coupled to a source of power for power supply to the corresponding LED chip 250 (260, 270). Each LED chip 250 (260, 270) is capable of emitting light in a unique color. In the embodiments shown in FIGS. 2a-2c, the LED chip 250 is capable of emitting light in a red color, the LED chip 260 is capable of emitting light in a blue color and the LED chip 270 is capable of emitting light in a green color.

As shown in FIGS. 2b and 2c, the lenses 210, 220 and 230 and the corresponding LED chips 250, 260 and 270 are assembled such that the first surface 212 of the lens 210 is in contact with the second surface 234 of the lens 230, the first surface 222 of the lens 220 is in contact with the second surface 214 of the lens 210, and the first surface 232 of the lens 230 is in contact with the second surface 224 of the lens 220. The corresponding LED chips 250, 260 and 270 are positioned substantially proximate to each other. As assembled, the lenses 210, 220 and 230 define an axis 205 that is coincident with the cross line 215 (225, 235) of the first surface 212 (222, 232) and the second surface 214 (224, 234) of each lens 210 (220, 230), and the three LED chips 250, 260 and 270 are aligned in an array with a geometrical center substantially at the axis 205.

The lenses 210, 220 and 230 and the LED chips 250, 260 and 270 can also be assembled to form an LED package structure in other forms. For example, as shown in FIG. 2a, they are assembled such that the first surface 212 of the lens 210 and the second surface 234 of the lens 230 define a gap 281, the first surface 222 of the lens 220 and the second surface 214 of the lens 210 define a gap 283, and the first surface 232 of the lens 230 and the second surface 224 of the lens 220 define a gap 285. The gaps 281, 283 and 285 may be filled with a transparent medium.

FIGS. 3a and 3b show another two different embodiments of an LED package structure 300 of the present invention, respectively. The LED package structure 300 has four lenses 310, 320, 330a and 330b and four LED chips 350, 360, 370a and 370b embedded in the lenses 310, 320, 330a and 330b, respectively. The LED chips 350 and 360 are capable of emitting light in a red color and a blue color, respectively, while the LED chips 370a and 370b are capable of emitting light in a green color. Other combinations of LED chips can also be used to practice the present invention. For example, for a four LED chip configuration of an LED package structure, one combination is: one LED chip is capable of emitting light in a red color, one LED chip is capable of emitting light in a green color, and the other two LED chips are capable of emitting light in a blue color. Another combination is: one LED chip is capable of emitting light in a blue color, one LED chip is capable of emitting light in a green color, and the other two LED chips are is capable of emitting light in a red color. As shown in FIGS. 3a and 3b, all the four lenses 310, 320, 330a and 330b have an identically cross-sectional shape of a triangle. Each of the four lenses 310, 320, 330a and 330b has a first surface and a second surface. FIG. 3b corresponds to an embodiment of which the first surface of a lens is in contact with the second surface of one of the rest of the four lenses. FIG. 3a, as a variation, corresponds to an embodiment of which a transparent medium is placed between the first surface of a lens and the second surface of one of the rest of the four lenses.

Referring to FIGS. 4a and 4b, an LED package structure 400 is shown according to other embodiments of the present invention, respectively. The LED package structure 400 includes three lenses 410, 420 and 430 and three LED chips 450, 460 and 470 embedded in the lenses 410, 420 and 430, respectively. Each lens 410 (420, 430) has a body portion 418 (428, 438) with at least a first surface 412 (422, 432), and a second surface 414 (424, 434). As shown in FIGS. 4a and 4b, the body portion 418 (428, 438) of each lens 410 (420, 430) has a cross-sectional shape of a rectangle, and the first surface 412 (422, 432) and the second surface 414 (424, 434) of each lens 410 (420, 430) define an angle, $\theta_1$ ($\theta_2$, $\theta_3$), where the angle $\theta_1 = 180°$, $\theta_2 = 90°$ and $\theta_3 = 90°$, i.e., the first surface 412 and the second surface 414 of the lens 410 are substantially in a same plane. In the exemplary embodiments shown in FIGS. 4a and 4b, the LED chip 450 is capable of emitting light in a red color, the LED chip 460 is capable of emitting light in a blue color and the LED chip 470 is capable of emitting light in a green color.

As shown in FIG. 4b, the lenses 410, 420 and 430 and the LED chips 450, 460 and 470 are assembled such that the first surface 412 of the lens 410 is in contact with the second surface 434 of the lens 430, the first surface 422 of the lens 420 is in contact with the second surface 414 of the lens 410, and the first surface 432 of the lens 430 is in contact with the second surface 424 of the lens 420. The LED chips 450, 460 and 470 are positioned substantially proximate to each other to form an array having a geometrical center. As assembled, the lenses 410, 420 and 430 define an axis 405 that is coincident with the geometrical center of the LED chip array.

FIG. 4a shows an LED package structure 400 in another embodiment, where the lenses 410, 420 and 430 and the LED chips 450, 460 and 470 are assembled such that the first surface 412 of the lens 410 and the second surface 434 of the lens 430 define a gap 481, the first surface 422 of the lens 420 and the second surface 414 of the lens 410 define a gap 483, and the first surface 432 of the lens 430 and the second surface 424 of the lens 420 define a gap 485. The gaps 481, 483 and 485 may be filled with a transparent medium.

Another aspect of the present invention provides a method for packaging LEDs. In one embodiment, the method includes the step of forming an optical element having a lens and an LED chip, where the lens has a body portion with at least a first surface, a second surface, a third surface and a fourth surface, and the LED chip has a first conductive lead and a second conductive lead. In one embodiment, the forming step comprises the step of embedding the LED chip into the body portion of the lens such that the first conductive lead and the second conductive lead of the LED chip extend out of the body portion from one of the third surface and the fourth surface of the corresponding lens.

Furthermore, the method includes the step of assembling an LED package structure comprising at least a first optical element having an LED chip capable of emitting light in a red color, a second optical element having an LED chip capable of emitting light in a blue color and a third optical element having an LED chip capable of emitting light in a green color such that the first surface of the lens of one of the first, second and third optical elements is in contact with the second surface of the lens of one of the rest of the first, second and third optical elements and the three LED chips are positioned substantially proximate to each other.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A light emitting diode (LED) package structure, comprising:
    a. at least three lenses, each lens having a body portion with at least a first surface, a second surface, a third surface, a fourth surface and a fifth surface that intersects with the first surface, the second surface and the fourth surface such that the fifth surface defines a concave portion in the body portion; and
    b. at least three LED chips, each LED chip being capable of emitting light in a unique color and having a first conductive lead and a second conductive lead and embedded in the body portion of a corresponding lens such that the first conductive lead and the second conductive lead extend out of the body portion from one of the third surface and the fourth surface of the corresponding lens, wherein the at least three lenses and the at least three LED chips are assembled such that the first surface of one of the at least three lenses is substantially in contact with the second surface of one of the rest of the at least three lenses so that a concave is defined by the fifth surfaces of the at least three lenses and the at least three LED chips are positioned substantially proximate to each other and the at least three lenses form a shape of a sphere, a rectangle or a quadrate.

2. The LED package structure of claim 1, wherein the at least three LED chips comprise at least a first LED chip capable of emitting light in a red color, a second LED chip capable of emitting light in a blue color, or a third LED chip capable of emitting light in a green color.

3. The LED package structure of claim 1, wherein the first surface and the second surface of each lens are capable of refracting light emitted from a corresponding embedded LED chip.

4. The LED package structure of claim 1, wherein each of the at least three lenses is made of a transparent material.

5. The LED package structure of claim 4, wherein the transparent material comprises glass, plastic, resin, or a combination of them.

6. The LED package structure of claim 1, wherein the first surface and the second surface of the i-th lens define an angle, $\theta_i$, therebetween, wherein i=1, 2, and 3.

7. The LED package structure of claim 6, wherein the angle $\theta_i$ satisfies the relationship of $90° \leq \theta_i \leq 180°$.

8. The LED package structure of claim 7, wherein the body portion of each lens has a cross-sectional shape selected from the list of a sector, a closed loop, a triangle, a quadrilateral and a polygon.

9. The LED package structure of claim 8, wherein as assembled, the at least three lenses define an axis that is coincident with a cross line of the first surface and the second surface of each lens.

10. The LED package structure of claim 9, wherein as assembled, the at least three LED chips are aligned in an array with a geometrical center substantially at the axis.

11. A light emitting diode (LED) package structure, comprising:
    a. at least three lenses, each lens having a body portion with at least a first surface, a second surface, a third surface, a fourth surface and a fifth surface that intersects with the first surface, the second surface and the fourth surface such that the fifth surface defines a concave portion in the body portion; and
    b. at least three LED chips, each LED chip being capable of emitting light in a unique color and having a first conductive lead and a second conductive lead and embedded in the body portion of a corresponding lens such that the first conductive lead and the second conductive lead extend out of the body portion from one of the third surface and the fourth surface of the corresponding lens; and
    c. a transparent medium;
    wherein the at least three lenses and the at least three LED chips are assembled and the transparent medium is placed between the first surface of one of the at least three lenses and the second surface of one of the rest of the at least three lenses so that a concave is defined by the fifth surfaces of the at least three lenses and the at least three LED chips are positioned substantially proximate to each other.

12. A method for packaging light emitting diodes (LEDs), comprising the steps of:
    a. forming a plurality of optical elements, each optical element having a lens and an LED chip, wherein the lens has a body portion with at least a first surface, a second surface, a third surface, a fourth surface and a fifth surface that intersects with the first surface, the second surface and the fourth surface such that the fifth surface defines a concave portion in the body portion, and the LED chip has a first conductive lead and a second conductive lead and embedded in the body portion of the lens such that the first conductive lead and the second conductive lead extend out of the body portion from one of the third surface and the fourth surface of the lens; and
    b. assembling an LED package structure comprising at least a first optical element of the plurality of optical elements having an LED chip capable of emitting light in a red color, a second optical element of the plurality of optical elements having an LED chip capable of emitting light in a blue color and a third optical element of the plurality of optical elements having an LED chip capable of emitting light in a green color such that the first surface of the lens of one of the first, second and third optical elements is substantially in contact with the second surface of the lens of one of the rest of the first, second and third optical elements so that a concave is defined by the fifth surfaces of the first, second and third optical elements and the three LED chips are positioned substantially proximate to each other.

13. The method of claim 12, wherein the forming step comprises the step of embedding the LED chip into the body portion of the lens such that the first conductive lead and the second conductive lead of the LED chip extend out of the body portion from one of the third surface and the fourth surface of the lens.

* * * * *